United States Patent
Heikkinen et al.

(10) Patent No.: US 10,667,401 B2
(45) Date of Patent: May 26, 2020

(54) MULTILAYER STRUCTURE AND RELATED METHOD OF MANUFACTURE FOR ELECTRONICS

(71) Applicant: TactoTek Oy, Oulunsalo (FI)

(72) Inventors: Mikko Heikkinen, Oulunsalo (FI); Antti Keränen, Oulunsalo (FI); Jarmo Sääski, Oulunsalo (FI); Ronald H. Haag, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/045,009

(22) Filed: Jul. 25, 2018

(65) Prior Publication Data

US 2018/0359860 A1    Dec. 13, 2018

Related U.S. Application Data

(63) Continuation of application No. 15/483,417, filed on Apr. 10, 2017, now Pat. No. 10,057,989.

(51) Int. Cl.
| | |
|---|---|
| *H05K 3/32* | (2006.01) |
| *H05K 1/18* | (2006.01) |
| *H05K 3/28* | (2006.01) |
| *H05K 1/02* | (2006.01) |
| *H05K 1/11* | (2006.01) |
| *H05K 1/14* | (2006.01) |

(Continued)

(52) U.S. Cl.
CPC .......... *H05K 1/185* (2013.01); *H05K 1/0284* (2013.01); *H05K 1/112* (2013.01); *H05K 1/148* (2013.01);
(Continued)

(58) Field of Classification Search
CPC .......... H05K 3/284; H05K 3/40; H05K 3/32; H05K 3/30; H05K 1/185; H05K 1/189;
(Continued)

(56) References Cited

U.S. PATENT DOCUMENTS 4,956,913 A * 9/1990 Eck ............... H01R 43/205
29/213.1
5,285,107 A * 2/1994 Kazami ............ H01L 21/67121
257/678

(Continued)

FOREIGN PATENT DOCUMENTS

| EP | 1734615 A1 | 12/2006 |
|---|---|---|
| EP | 2285195 A1 | 2/2011 |

(Continued)

OTHER PUBLICATIONS

International Search Report dated Oct. 16, 2018 issued in PCT/FI2018/050251.

(Continued)

*Primary Examiner* — Peter Dungba Vo
*Assistant Examiner* — Kaying Kue
(74) *Attorney, Agent, or Firm* — Robert P. Michal, Esq.; Carter, DeLuca & Farrell LLP

(57) ABSTRACT

A method for manufacturing a multilayer structure, includes obtaining a substrate film for accommodating electronics, providing, preferably at least in part by printed electronics technology, a number of conductive traces, and optionally electronic components, at least on a first side of the substrate film to establish a predetermined circuit design, providing a connector element to said substrate film to electrically connect to the circuit, wherein the substrate film is arranged with at least one hole, preferably through hole, substantially matching the location of the connector element so that a number of electrically conductive contact members of the connector element are accessible from a second, opposite side of the substrate film via said at least one hole, and molding thermoplastic material on said first side of the substrate film and said connector element to substantially cover the established circuit and the side of the connector element facing the material.

20 Claims, 3 Drawing Sheets

(51) Int. Cl.
   *H05K 3/00* (2006.01)
   *H05K 3/36* (2006.01)

(52) U.S. Cl.
   CPC ........... *H05K 1/189* (2013.01); *H05K 3/0014* (2013.01); *H05K 3/284* (2013.01); *H05K 3/368* (2013.01); *H05K 1/0269* (2013.01); *H05K 1/142* (2013.01); *H05K 1/184* (2013.01); *H05K 2201/0397* (2013.01); *H05K 2201/048* (2013.01); *H05K 2201/09063* (2013.01); *H05K 2201/09754* (2013.01); *H05K 2201/1053* (2013.01); *H05K 2201/10189* (2013.01); *H05K 2201/10265* (2013.01); *H05K 2201/10318* (2013.01); *H05K 2201/10325* (2013.01); *H05K 2201/10522* (2013.01); *H05K 2203/1316* (2013.01); *H05K 2203/1327* (2013.01)

(58) Field of Classification Search
   CPC ...... H05K 1/0284; H05K 1/112; H05K 1/148; H05K 1/0269; H05K 1/142; H05K 1/184; H05K 2201/1053; H05K 2201/10265; H05K 2201/10318; H05K 2201/10522; H05K 2203/1327; H05K 2203/1316; Y10T 29/49146; Y10T 29/4913; Y10T 29/49158; Y10T 29/49155; Y10T 29/49222; Y10T 29/49204
   USPC ......... 29/874, 876–884, 832, 831, 830, 854, 29/841, 855
   See application file for complete search history.

(56) References Cited

U.S. PATENT DOCUMENTS

| | | | | |
|---|---|---|---|---|
| 5,355,282 A | | 10/1994 | Yokemura et al. | |
| 5,554,821 A | * | 9/1996 | Patterson | H05K 3/284 174/541 |
| 5,682,675 A | * | 11/1997 | Hirota | H01R 43/205 29/840 |
| 5,685,073 A | * | 11/1997 | Estes | H01R 12/52 29/827 |
| 5,841,190 A | * | 11/1998 | Noda | H01L 23/3107 257/678 |
| 5,983,491 A | * | 11/1999 | Wang | H05K 5/0269 29/830 |
| 6,033,935 A | * | 3/2000 | Dozier, II | B23K 3/087 257/E23.004 |
| 6,200,143 B1 | * | 3/2001 | Haba | H01R 13/193 29/830 |
| 6,329,228 B1 | * | 12/2001 | Terashima | H01L 21/486 257/675 |
| 6,347,946 B1 | * | 2/2002 | Trobough | G01R 1/0416 361/790 |
| 6,521,983 B1 | * | 2/2003 | Yoshimatsu | H01L 25/072 257/678 |
| 6,583,355 B2 | * | 6/2003 | Skrzypchak | H01L 21/56 174/521 |
| 6,585,527 B2 | * | 7/2003 | Koopman | H01R 13/2435 439/66 |
| 6,708,398 B2 | * | 3/2004 | Wakashima | H01L 21/486 257/E23.069 |
| 6,958,535 B2 | * | 10/2005 | Hirano | H01L 23/3737 257/668 |
| 7,059,047 B2 | * | 6/2006 | Dozier, II | B23K 3/087 257/E23.004 |
| 7,170,306 B2 | * | 1/2007 | Karavakis | G01R 1/0408 29/825 |
| 7,208,967 B2 | | 4/2007 | Ho et al. | |
| 7,380,337 B2 | * | 6/2008 | Soeta | G01R 1/0483 257/E23.078 |
| 7,706,146 B2 | * | 4/2010 | Lee | H01L 25/165 361/752 |
| 7,765,693 B2 | * | 8/2010 | Brodsky | H01R 13/2407 29/854 |
| 8,102,670 B2 | * | 1/2012 | Sakamoto | H05K 1/144 361/792 |
| 8,107,255 B2 | * | 1/2012 | Sakamoto | H05K 1/144 361/695 |
| 8,341,835 B1 | * | 1/2013 | Huemoeller | H01L 21/56 29/841 |
| 8,834,182 B2 | * | 9/2014 | Clayton | H01R 12/78 439/67 |
| 8,854,820 B2 | * | 10/2014 | Yamamoto | H01L 21/565 361/704 |
| 9,661,773 B2 | * | 5/2017 | Mijac | H05K 5/0056 |
| 10,057,989 B1 | * | 8/2018 | Heikkinen | H05K 1/189 |
| 2004/0178812 A1 | * | 9/2004 | Karavakis | G01R 1/0408 29/884 |
| 2005/0070046 A1 | * | 3/2005 | Saito | H01L 21/4867 438/106 |
| 2006/0162156 A1 | * | 7/2006 | Reed | B29C 45/14647 29/841 |
| 2006/0272150 A1 | * | 12/2006 | Eguchi | H05K 5/0082 29/841 |
| 2007/0169879 A1 | | 7/2007 | Hakansson | |
| 2007/0186412 A1 | * | 8/2007 | Hsu | H05K 1/112 29/830 |
| 2007/0194428 A1 | | 8/2007 | Sato et al. | |
| 2008/0253140 A1 | * | 10/2008 | Fleischmann | B60Q 1/2696 362/487 |
| 2008/0296047 A1 | | 12/2008 | Kaji | |
| 2009/0086455 A1 | * | 4/2009 | Sakamoto | H05K 1/144 361/796 |
| 2009/0103276 A1 | * | 4/2009 | Sakamoto | H05K 1/144 361/792 |
| 2009/0212798 A1 | * | 8/2009 | Kasukabe | G01R 1/06733 324/754.07 |
| 2010/0002398 A1 | | 1/2010 | Braunisch et al. | |
| 2010/0110647 A1 | * | 5/2010 | Hiew | H01L 21/565 361/752 |
| 2010/0243309 A1 | * | 9/2010 | Kim | H05K 3/363 174/263 |
| 2010/0284159 A1 | * | 11/2010 | Sakamoto | H05K 1/144 361/752 |
| 2012/0106095 A1 | * | 5/2012 | Daniel | H05K 1/0283 361/746 |
| 2012/0106112 A1 | * | 5/2012 | Knies | H01L 24/97 361/783 |
| 2014/0000951 A1 | * | 1/2014 | Ryu | H05K 1/02 174/261 |
| 2014/0076772 A1 | * | 3/2014 | Azumi | H05K 5/062 206/706 |
| 2014/0106578 A1 | * | 4/2014 | Clayton | H01R 12/78 439/67 |
| 2014/0120786 A1 | | 5/2014 | Bishop | |
| 2014/0182918 A1 | * | 7/2014 | Ogawa | H01L 23/3121 174/262 |
| 2014/0268574 A1 | * | 9/2014 | Itoi | H05K 1/186 361/712 |
| 2015/0342071 A1 | * | 11/2015 | Mijac | H05K 5/0056 361/752 |
| 2015/0382470 A1 | * | 12/2015 | Kuboki | B29C 45/14065 361/761 |

FOREIGN PATENT DOCUMENTS

WO  2008058782 A1  5/2008
WO  WO-2013132815 A1  9/2013

OTHER PUBLICATIONS

Office Action issued in U.S. Appl. No. 15/483,417 dated Feb. 9, 2018 (7 pages).

(56) References Cited

OTHER PUBLICATIONS

Office Action issued in U.S. Appl. No. 15/483,417 dated Mar. 29, 2018 (13 pages).

* cited by examiner

MULTILAYER STRUCTURE AND RELATED METHOD OF MANUFACTURE FOR ELECTRONICS

CROSS-REFERENCE SECTION

This application is a continuation of U.S. patent application Ser. No. 15/483,417 filed Apr. 10, 2017, the entire disclosure of which is incorporated herein by reference.

The project leading to this application has received funding from the European Union's Horizon 2020 research and innovation programme under grant agreement No 725076.

FIELD OF THE INVENTION

Generally the present invention relates to electronics, associated devices, structures and methods of manufacture. In particular, however not exclusively, the present invention concerns provision of external electrical connection to the internals of a structure containing a film layer and adjacent molded plastics layer integrated together.

BACKGROUND INFORMATION

Generally there exists a variety of different stacked assemblies and structures in the context of electronics and electronic products.

The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not necessarily always the case.

When a multilayer structure is loaded with various electronics, it may not always function completely in isolation, i.e. autonomously. Instead, various power, data and/or control connections may have to be provided, or are at least preferably provided, e.g. occasionally upon particular need, thereto, which typically requires provision of electrical connectors and related wiring even though also wireless connections may be applicable as well.

Commonly, the wired electrical connections between the environment and the embedded electronics of a stacked multilayer structure are provided at a side edge of the structure so that the necessary external wiring is brought into contact with a connector or other contact element that is located at, and potentially protrudes out from, the structure at a periphery thereof. However, in many use scenarios such configuration of connectors and external wiring is sub-optimum, because it easily puts additional constraints on the dimensioning and positioning of related host structures and components, not forgetting the features and manufacturing of the multilayer structure itself.

SUMMARY

The objective of the present invention is to at least alleviate one or more of the above drawbacks associated with the existing solutions in the context of integral multilayer structures and electronics embedded therein.

The objective is achieved with various embodiments of a multilayer structure and related method of manufacture in accordance with the present invention.

According to one embodiment of the present invention, a multilayer structure suitable for use with an electronic device comprises a substrate film having a first side and an opposite second side, said substrate film comprising electrically substantially insulating material, a number of conductive traces, optionally defining contact pads and/or elongated conductors, preferably printed by printed electronics technology, at least on the first side of the substrate film for establishing a desired circuit design, a connector element provided to, optionally substantially laid upon the first side of, said substrate film, which may be flexible or rigid, or formable or flexible at certain temperatures, that is, depending on the temperature of said film or the material thereof, one side of the connector element facing the structure internals and the other, opposite side facing the environment on the second side of the substrate film via at least one hole, preferably a through hole, defined in the substrate film, said connector element comprising a number of electrically conductive contact members electrically, mechanically and/or chemically, such as by utilizing an adhesive or soldering, connected to the circuit on the first side of the substrate film and configured to contact one or more electrical contact members of an external element, such as of a connector of an external device or a of connector cable extending between the structure and the external device or other external element, responsive to mating the external element with the connector element, and a plastic layer molded onto said first side of the substrate film and said one side of the connector element so as to cover said one side of the connector element and the circuit.

The desired, predetermined circuit design may be defined prior to manufacturing the multilayer structure and thus provide instructions and/or locations for various conductive traces, contact pads, and/or conductors to be arranged to the substrate film.

The "contact pad" refers herein to any electrically conductive element or a patch, or a point or area of electrical coupling on the substrate film. The contact pad may comprise or be made of conductive material, such as copper, silver, aluminum, or conductive elastomer, comprising e.g. carbon or other conductive particles, or other such materials which may optionally enhance the visual quality of the surface on or within which the pad resides. The shape of the contact pad may be any suitable geometric shape. The shape of the pad may advantageously be chosen based on the shape or characteristics of the product or part of the product intended to be manufactured and include said contact pad.

The "substrate film" may comprise or consist of materials such as organic or biomaterials, such as wood, leather or fabric, or a combination of any of these materials with each other or with plastics or polymers or metals. The film may be thermoplastic.

The "plastic layer" molded onto the substrate film may comprise materials such as polymer, organic, biomaterial, composite, such as organic or graphic, as well as any combination thereof.

The material may be thermoplastic material.

The "external element" may be, for example, a socket structure or a cable, which may be soldered or adhered to a circuit board of e.g. external device.

In various embodiments, the connector element may comprise a preferably substantially rigid (stiff) piece of material such as a plate or other substantially planar element. However, the shape may also be any other suitable shape that is well-suited for a particular embodiment. The shape may be, for example, an arc-shape or any complex shape with respect to basic geometric shapes. The element may be of metal or comprise metal as a constituent material. The element may define a number of contact members, i.e. at least one contact member for the contact member(s) of an external element such as external connector to be mated with the multilayer structure in terms of galvanic connection.

In various embodiments, the connector element may comprise a circuit board such as a printed circuit board optionally of flex or rigid (e.g. FR4) type.

In various embodiments, the connector element may comprise at least one electronic component, such as a transistor or an integrated circuit (IC), e.g. an operational amplifier (which could naturally also be constructed from individual components).

In view of the foregoing, the connector element may be thus configured to accommodate components that are harder or practically impossible to mount or fabricate on a film type, typically rather thin and flexible, substrate, for example.

The first side and thus the associated first surface of the substrate film has been at least partially, having regard to the related surface area, overmolded by plastic, preferably and typically thermoplastic, material. Optionally, several overmolding-applicable materials may be utilized to establish one or more molded layers, e.g. adjacent layers lying side-to-side on the first side of the substrate and/or forming a stack of multiple superposed layers thereon.

Optionally, a further, second film is provided on the other side of the molded layer. The second film, which may act as a substrate for graphics and/or electronics, such as mounted and/or printed electronic components and/or traces, conductors, or insulating elements, therefore faces the molded layer from a direction opposite to the primary, or first, substrate film. The second film may have been positioned, i.e. inserted, in a mold together with the first film enabling plastic material to be injected between them. Alternatively, the second film may have been laminated onto the molded layer by feasible lamination technology using e.g. adhesive, elevated temperature and/or pressure based bonding. The second film may be electrically connected to the first film using conductive material between them.

In some embodiments, the (thermo)plastic material used to establish the molded layer comprises optically substantially opaque, transparent or translucent material enabling e.g. visible light to pass through it with negligible loss. The sufficient transmittance at desired wavelengths may be about 80%, 85%, 90% or 95% or higher, for example. Possible further molded (thermo)plastic material may be substantially opaque or translucent. In some embodiments, the further material may be transparent.

In a further, either supplementary or alternative, embodiment one or more of the included films may at least partially be optically substantially opaque or at least translucent having regard to predefined wavelengths e.g. in visible spectrum. The film may have been initially provided with visually distinguishable, decorative/aesthetic and/or informative, features such as graphical pattern and/or color thereon or therein. The features may have been provided on the same side of the film with the electronics so that they have been also sealed by the plastic material(s) through the associated overmolding procedure. Accordingly, IML (in-mold labeling)/IMD (in-mold decoration) technique is applicable. The film(s) may be at least partially, i.e. at least in places, optically transparent to radiation such as visible light emitted by the electronics thereon. The transmittance may be about 80%, 85%, 90%, 95% or higher, for example.

Yet, a system comprising an embodiment of the multilayer structure and an embodiment of the external element compatible for mating with the connector element of the structure may be provided.

According to one other embodiment of the present invention, a method for manufacturing a multilayer structure, comprises obtaining a substrate film for accommodating electronics, providing, preferably by at least part by printed electronics technology, a number of conductive traces, and optionally electronic components, at least on a first side of the substrate film to establish a predetermined circuit design, providing an optionally substantially rigid electrical connector element to said substrate film, preferably substantially upon the first side thereof, to electrically connect to the circuit, wherein the substrate film is arranged with at least one hole, preferably through hole, substantially matching the location of the connector element so that a number of electrically conductive contact members of the connector element are accessible from a second, opposite side of the substrate film via said at least one hole, and molding thermoplastic material on said first side of the substrate film and said connector element to substantially cover the established circuit and the side of the connector element facing the material.

The method may further comprise providing additional material(s) and/or element(s) that are configured to attach the connector element mechanically and/or connect it electrically to the circuit e.g. via preferably printed traces or contact pads. For the purpose, e.g. conductive adhesive or especially ACF (anisotropic conductive film) material and related bonding technique may be applied. In detail, suitable anisotropic material such as paste or film may be first provided on the contact area to electrically connect the circuit and the connector element together. The connector element may be then pressed against the anisotropic material. Optionally, heat may be applied to enhance the attachment of the associated adhesive (e.g. through better flow).

In some embodiments, one or more substrate films may be formed, optionally thermoformed, to exhibit a desired, typically essentially three-dimensional, target shape preferably following the provision of conductors and optional further electronics such as electronic components thereon but prior to molding the plastic layer.

The at least one hole may be provided by molding (or generally directly establishing the substrate film as provided with the hole), drilling, carving, sawing, etching, cutting (e.g. with laser or mechanical blade) or using any other feasible method as being understood by a person skilled in the art.

The at least one hole may have a desired shape, i.e. a substantially circular or angular shape, e.g. a rectangular shape. Preferably the hole is shaped and dimensioned so as to match the shapes/dimensions of the connector element so that contact member(s) of the connector element may be reached from the environment on the second side of the substrate film.

Preferably the at least one hole is a through hole. Alternatively, at least one of the holes of the at least one hole may be a blind hole. In that case, upon connecting the external element to the structure, conductive protrusions such as pins of the external element may be optionally utilized to pierce through the bottom of the blind hole to establish electrical contact with the contact members of the underlying connector element. In some embodiments, the hole may contain a removable cover, such as a bendable flap defined by the substrate through cutting the flap section partially loose therefrom.

A number of electronic components may be provided, by printing and/or mounting, for example, on the first side of the substrate film and optionally on a potential top film to establish the desired circuit thereon, which may have control, measurement, UI, data processing, storage, etc. purpose. Alternatively or additionally, specifically the connector element may be provided with a number of components, optionally integrated circuit(s), and e.g. a circuit board. Accordingly, an electronic sub-assembly with a circuit board and component(s) of its own may be provided on the substrate(s) and/or the connector element.

The mutual execution order of various method items may be determined case-specifically in each embodiment. For example, the opening may be established prior to, upon or after provision of the connector element to the substrate.

As alluded to above, optionally a further, second film may be provided on the other side of the molded plastic as mentioned hereinbefore. It may be located in a mold as well together with the primary first substrate carrying the flap so that a stacked structure is obtained by injecting the plastic material in between, or the second film may be provided afterwards using a suitable lamination technique if not being directly manufactured on the molded plastic layer. The second film may have electronics on any side thereof as well as e.g. graphics (application of IMD/IML technique thus possible). Yet, it may have a protective purpose and/or other technical features such as desired optical transmittance, appearance (e.g. color) or feel.

The feasible molding methods include e.g. injection molding. In case of several plastic materials, they may be molded using a two-shot or generally multi-shot molding method. A molding machine with multiple molding units may be utilized. Alternatively, multiple machines or a single re-configurable machine could be used for sequentially providing several materials.

The previously presented considerations concerning the various embodiments of the multilayer structure may be flexibly applied to the embodiments of the method mutatis mutandis, and vice versa, as being appreciated by a skilled person.

The utility of the present invention arises from a plurality of issues depending on the embodiment.

An electrical connector element may be conveniently integrated and embedded within a functional, electronics-containing multilayer structure. The element may comprise or consist of conductive material such as preferred metal (silver, copper, gold, etc.) or e.g. conductive polymer, which is used to establish electrical connection to the circuit on the host substrate, internal connection(s) of the connector element and/or contact members for contacting the compatible counterparts of an external element such as connector of an external device or of a connecting cable therefor. Complex and space-consuming connectors with own dedicated housing outside the multilayer structure may be omitted. The location of the connector element(s) may be flexibly determined and there's no need to position the connectors e.g. at the lateral edges of a multilayer structure anymore, which greatly adds to the structural and potentially also functional versatility of the structure and host devices or products they may be disposed at.

The connector element may be of or at least comprise structurally durable, e.g. rigid material such as metal, thus tolerating repeated installation and removal of external elements such as external connectors relative thereto. Yet, the connector element may be supplemented with integral or separate support elements such as bosses or boss-base combinations in the multilayer structure. The support elements may be optionally established by molded plastics. One function of the support elements may be in retaining the external element such as an external connector in correct position and preventing it from getting loose unintentionally in relation to the multilayer structure. Yet, the support elements may be used to secure and/or align the multilayer structure itself relative to a potentially bigger host device or generally element. Further features such as screws or rivets may be applied in connection with the support elements for securing the structure to the external element. The support element may define a hole, or more specifically a threaded hole dimensioned for desired threaded fixing element such as screws.

The suggested manufacturing method applying overmolding is relatively straightforward and what is considered beneficial, does not necessitate adopting completely new or different manufacturing technologies just for producing the sufficient connectivity in the context of printed and in-mold electronics. By (thermo)forming the film(s) to a desired 3D shape after provision of conductors and optional further electronics thereon while the substrate film was still substantially planar, may reduce or obviate a need for 3D assembly of electronics on a substrate.

A similar connector element could also find use in other scenarios wherein the electrical connection is potentially unnecessary, but e.g. optical connection is desired. Instead or in addition to conductive material, electrical wiring or e.g. printed traces, the connector may comprise e.g. optical fiber.

Generally, the obtained multilayer structure may be used to establish a desired device or module in a host element such as an intelligent garment (e.g. shirt, jacket, or trousers, or e.g. a compression garment), other piece of wearable electronics (e.g. wristop device, headwear, or footwear), vehicle such as vehicle exterior or interior (e.g. in-vehicle electronics), personal communications device (e.g. smartphone, phablet or tablet) or other electronics. The integration level of the obtained structure may be high and desired dimensions such as the thickness thereof small.

The used film(s) may contain graphics and other visually and/or tactilely detectable features thereon, whereupon the film may have aesthetic and/or informative effect in addition to hosting and protecting the electronics. The film(s) may be translucent or opaque at least in places. They may impart a desired color or comprise portions imparting a desired color to the corresponding portions of the structure. The obtained multilayer structure may thus incorporate one or more color/colored layers that optionally determine graphics such as text, pictures, symbols, patterns, etc. These layers may be implemented by dedicated films of certain color(s), for instance, or provided as coatings (e.g. through printing) on existing film(s), molded layer(s), and/or other surfaces.

The film(s) may be configured to establish at least a portion of outer and/or inner surface of the associated product.

The visual features such as patterns or coloring may be provided via internal layers, e.g. on the side of the first and/or potential second film that is facing the molded plastics so that the features remain isolated and thus protected from the environmental effects at least by the thickness of the film. Accordingly, different impacts, rubbing, chemicals, etc. that could easily damage e.g. painted surface features do not normally reach them. The film may be easily manufactured or processed, optionally cut, into a desired shape with necessary characteristics such as holes or notches for exposing the underlying features such as the molded material.

The molded thermoplastic material(s) may be optimized for various purposes including securing electronics in view of the molding process. Yet, the material may be configured to protect the electronics from e.g. environmental conditions such as moisture, heat, cold, dirt, shocks, etc. It may further have desired properties in view of light transmittance and/or elasticity, for example. In case the embedded electronics includes light- or other radiation-emitting or receiving components, the material may have sufficient transmittance to enable light transmission therethrough. The molded material may originally exhibit a number of colors or it may be colored afterwards by ink, paint or film coating, for example.

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated.

The terms "film" and "foil" are herein used generally interchangeably, unless otherwise explicitly indicated.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1:
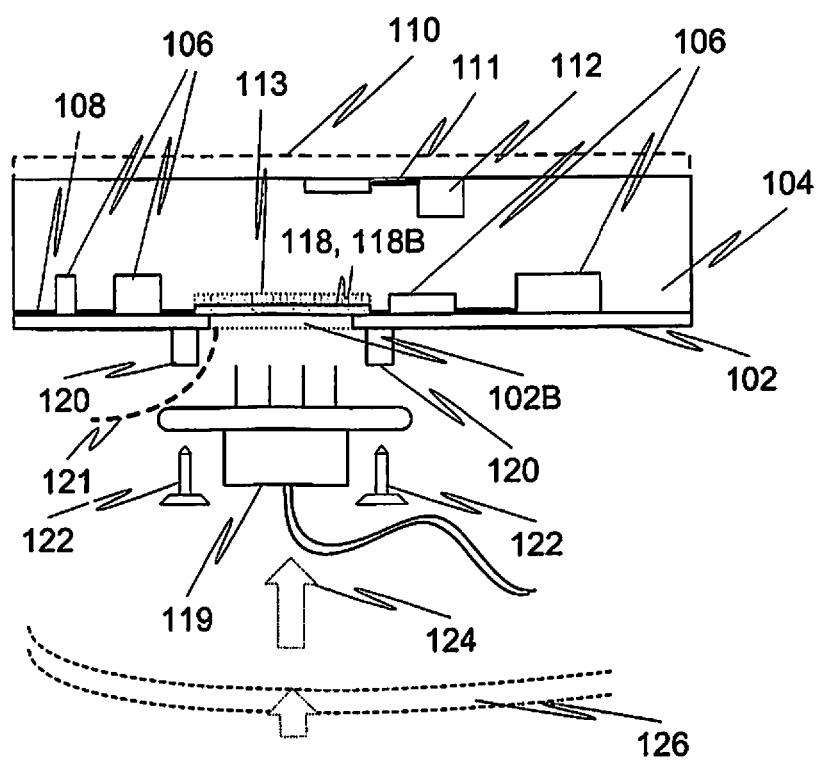
FIG. 1 illustrates one embodiment of a multilayer structure in accordance with the present invention.
Figure 2:
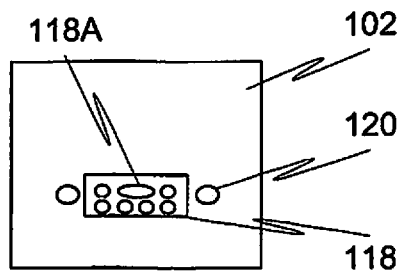
FIG. 2 depicts a bottom view of the embodiment of the multilayer structure of FIG. 1 with a planar view of the connector element.

FIG. 1 illustrates, via a cross-sectional side view, an embodiment 100 of a multilayer structure. In FIG. 1, at 200 a potential bottom view of the embodiment of the multilayer structure 100 of FIG. 1 is shown.

The finished multilayer structure 100 may establish an end product of its own, e.g. electronic device or element (e.g. cable, connector device), or be disposed in a host device as an aggregate part or module. It 100 may comprise a number of further elements or layers not shown in the figure.

The structure 100 contains at least one substrate film 102 accommodating a number of electrical conductors 108 preferably printed thereon by means of printed electronics technology such as screen printing, tampo printing, flexography or ink jetting. A number of elements such as electronic components 106 may be further provided upon the film 102. The printed elements incorporating at least the traces 108 are configured so as to establish a desired circuit design.

In addition to or instead of printed versions, the components 106 may include ready-made components (surface-) mounted on the substrate 102, such as so-called surface-mounted elements. For example, adhesive may be utilized for mechanically securing the electronics on the substrate. Additional conductive material(s) such as conductive adhesive and/or solder may be applied for establishing electrical and also mechanical connections between various elements such as conductor traces 108 and components 106.

The components 106 may thereby include passive components, active components, ICs (integrated circuit), printed, such as screen printed, components and/or electronic subassemblies. For instance, one or more components may be first provided on a separate substrate, e.g. a circuit board such as an FPC (flexible printed circuit) or e.g. rigid, e.g. FR4 type (flame retardant), board, and subsequently attached as a whole (i.e. as a sub-assembly) to the target substrate 102 or a connector element 118.

In more detail, the components 106 may include at least one electronic element selected from the group consisting of: optoelectronic component, microcontroller, microprocessor, signal processor, DSP (digital signal processor), sensor, programmable logic chip, memory, transistor, resistor, capacitor, inductor, memory array, memory chip, data interface, transceiver, wireless transceiver, transmitter, receiver, wireless transmitter, and wireless receiver.

Still, the components 106 hosted by the structure may include at least one optoelectronic component. The at least one optoelectronic component may include a LED (light-emitting diode), an OLED (organic LED), or some other light-emitting component, for example. The components may be side-emitting ('side shooting'). Alternatively or additionally, it may include a light-receiving or light-sensitive component such as a photodiode, photoresistor, other photodetector, or e.g. a photovoltaic cell. The optoelectronic component such as OLED may have been printed on the substrate film using a preferred method of printed electronics technology.

Indeed, e.g. different sensing and/or other functionalities may be implemented by the embedded ICs, dedicated components, or shared ICs/electronics (multi-purpose electronics).

The substrate film 102 and electronics 106, 108 establishing a desired circuit design thereat are at least partially covered by at least one, preferably molded, plastic layer 104. Accordingly, especially the components 106 are at least partially embedded in the molded material 104.

An optional second film 110 of same or different material with the first film 102 may be present in the multilayer stack as well. The film 110 may accommodate electronics 112, graphics 111 and/or other features considered advantageous.

Further film, coating, etc. may be optionally provided on the second film 110 e.g. for aesthetic, protective/insulating or other purposes.

At least one electrically conductive (at least in places) connector element 118 has been provided to the substrate 102 prior to molding the plastic layer(s) 104. The connector element 118 may include metal, plastics, especially e.g. PC (polycarbonate), polyimide, etc. The connector element 118 comprises a number of contact members 118A that are configured to electrically (galvanically) couple to compatible members of the external element 119.

The connector element 118 may be secured to the substrate film 102 using e.g. adhesive, paste, conductive adhesive, etc. Electrical connection between the circuit design 106, 108 on the substrate film 110 and the connector element 118 may be utilized by the same or dedicated feature such as solder, conductive adhesive or paste, wiring, contact areas/pads, pins, flex cable and/or e.g. element of anisotropic material having regard to electrical conductivity such as ACF (anisotropic conductive film).

Depending on the embodiment, one or more contact members 118A may comprise at least one feature selected from the group consisting of: springy contact member, spring-loaded contact member, spring-loaded contact pin or slip, contact pad, contact area, conductive anisotropic material such as the ACF, contact pin, hole preferably with walls and/or bottom of conductive material, socket, female socket, male plug or socket, hybrid socket, pin socket, and spring pin socket.

The connector element 118 may be substantially planar or at least comprise a planar portion or planar element, e.g. a body, in the case of multi-element construction. However, the shape may also be any other suitable shape that is well-suited for a particular embodiment. The shape may be, for example, an arc-shape or any complex shape with respect to basic geometric shapes, which may depend on the shape or characteristics of the counterpart of the connector. Item 113 refers in the shown embodiment, to optional substrate, which accommodates e.g. a connector body and/or a number of conductive contact members 118A, such as contact pads or generally contact areas, of the connector element 118. Yet, it 113 may accommodate conductors such as traces and/or conductive pads 108.

The contact members 118A may have been attached to the remaining connector element 118, such as body thereof, by adhesive and/or directly produced thereon by printing, for example. In some embodiments, e.g. a metal plate may directly define at least one contact member 118A of the connector element 118. In more detail, one or more portions of the metal or other conductive surface area of the plate may define one or more contact members 118A for the conductive contact members, such as pins, slips, or pads of the external element 119. As the plate may also define the actual body of the connector element 118, further substrate 113 may in some embodiments be unnecessary.

In various embodiments, the connector element 118 or e.g. specifically the aforesaid body/substrate 113 thereof is substantially rigid or stiff. It may then better withstand e.g. frequent physical mounting 124 and removal of external elements 110 such as connectors into or away from contact therewith, respectively. The mounting and removal may refer to simple push and pull type actions, or require more complex activities if the procedure involves use of e.g. additional fasteners as discussed hereinafter. The rigidity or generally durability of the element 118 may be obtained by means of suitable materials and related dimensions such as material thicknesses. For example, a metal plate of e.g. about 1 mm thick is considered somewhat durable for many applications. The element 118 may in addition to or instead of rigid portions include e.g. flexible, springy members such as spring-loaded elements to enhance securing of the external elements 119. Mating of the element 119 may be facilitated and/or the established connection therewith made stronger, for instance. In some embodiments, e.g. the substrate 113 may be essentially flexible whereas the remaining connector parts may be substantially rigid.

In some embodiments, subsequent to mating of the external element 119, such as a connector of an external device, to the connector element 118 of the suggested multilayer structure, desired portion(s) of the resulting aggregate structure including e.g. the connection region 118, 119 may be provided with additional material 126 to further protect and/or secure, among other potential objectives, the connection and related elements. For example, low pressure molding or resin dispensing (provision of epoxy) may be utilized for the purpose.

In some embodiments, the connector element 118 further comprises a number of electronic components such as one or more of the aforementioned ones, optionally at least one integrated circuit. It 118 may further include a circuit board that is flexible or rigid, e.g. FR4 type PCB. The circuit board may carry a number of electronic components such as the ones mentioned hereinbefore. The circuit board may establish a body or substrate member of the connector element 118.

Yet, the substrate film 102 is provided with a hole, or 'opening', 102B to enable external element 119 to reach the connector element 118 such that galvanic connection may be established between the two. The hole 102B may have been formed by drilling, cutting, etching or directly establishing, e.g. through molding, the film 102 with it.

In some embodiments, the connector element 118 may be substantially located on the first side and respective first surface of the substrate film 102 as shown in the figure. The element 119 overhangs the hole 102B and is supported by the substrate 102 from the areas surrounding the hole 102B.

Alternatively, the connector element 118 could be located so that at least portion thereof like underhang thereof, if not substantially the whole element 118, is positioned within a space defining the hole 102B. It 188 may fill the volume of the hole 102B substantially fully and connect to the substrate film 102 from the sides, or partially only.

In some embodiments such as in the shown one, the structure 100 contains at least one support and optionally simultaneously fastening element 120 for the external element 119 such as external connector. The support element 120 may protrude from the level bottom surface or level of the substrate film 102 towards the environment.

The support element 120 may be at least partially molded. For example, it may have been molded from the material of plastic layer 104 during the formation thereof. A mold may include recesses or other shapes corresponding to the ones of the support element 120 so that the molten plastic may fill such space upon molding the layer 104. For the purpose, the film 102 may contain a hole or at least weakened (e.g. thin) portion through which the molten plastic may enter during molding to establish the molded part of the element 120. Alternatively, the element 120 may be molded as a separate step or introduced to the structure 100 as a pre-prepared part.

The element 120 may include e.g. support and/or guiding surface(s) for positioning the external element 119 such as external connector of an external device properly relative to the structure 100 and e.g. connector element 118 thereof, or vice versa as it is ultimately a question of relative, mutual positioning of the structure 100 and external elements.

Yet, the support element 120 may comprise at least part of an overall securing or fixing arrangement, such as a boss, or a more comprehensive boss-base structure, for screws, rivets or other fasteners 122 to be inserted therein to lock the external element 119 in place, or to lock the structure 100 thereto, depending on the viewpoint as discussed above. For the purpose, the external element 119 may include e.g. a flange that is to remain between the head of the fastener 122 and the contact surface of the support element 120. The support element 120 may contain a recess, optionally a threaded opening for receiving a threaded element such as a screw. Alternatively, a thread-forming screw could be utilized to generate a thread in the support element 120.

In some embodiments, the hole 102 may be at least partially covered and/or filled by a cover 121 to protect the underlying connector element 118 when there is no external element 119 connected, for instance.

A removable or destructible cover 121 may incorporate e.g. a peelable, tearable, drillable, hinged, bendable, sliding, lift-off and/or other, preferably rotatable or translationally movable cover member that is operable, i.e. destructible or substantially removable, from the second side of the substrate film when access to the connector element 118 is needed. As mentioned hereinbefore, the cover member 121 may be established from a portion of the substrate 102 e.g. as a bendable or completely removable flap thereof. The portion may be pre-processed such as provided with anti-adhesive material on the first surface thereof prior to molding so that e.g. the molded layer 104 and/or other element thereon, such as the connector element 118, does not adhere thereto, or the adherence is at least reduced. Additionally or alternatively, pre-processing may incorporate e.g. local perforation, cutting or other mechanical and/or e.g. chemical processing (e.g. along the contour) by which the cover 121 is prepared easier to remove afterwards so as to reveal the underlying hole 102B and connector element 118.

Having regard to the material selections, the film(s) 102, 110 may substantially consist of or comprise at least one material selected from the group consisting of: polymer, thermoplastic material, PMMA (Polymethyl methacrylate), Poly Carbonate (PC), polyimide, a copolymer of Methyl Methacrylate and Styrene (MS resin), glass, Polyethylene Terephthalate (PET), carbon fiber, and metal.

In various embodiments, the film(s) 102, 110 may be flexible and thus be versatilely handled such as bent without breaking during the manufacture of the structure 100, for instance. Yet, their material may be selected so as to adopt a new shape responsive to e.g. thermoforming or cold forming procedure.

The film(s) 102, 110 may be shaped according to the requirements set by each use scenario. They 102, 110 may exhibit e.g. a rectangular, circular, or square general shape. They 102, 110 may be substantially imperforate or contain recesses, notches, cuts or openings, optionally filled with other material(s), for various purposes such as attachment to other elements, fitting electronics or other components, provision of passages for light or other radiation, fluid, etc.

The plastic layer(s) 104, preferably provided by the overmolding procedure, may generally incorporate e.g. elastomeric resin. In more detail, the layer(s) 104 may include one or more thermoplastic materials that include at least one material selected from the group consisting of: PC, PMMA, ABS, PET, nylon (PA, polyamide), PP (polypropylene), TPU (thermoplastic polyurethane), polystyrene (GPPS), TPSiV (thermoplastic silicone vulcanizate), and MS resin.

The film layer(s) 102, 110 as well as plastic layer(s) 104 or potential further layers (paint, ink, film(s), etc.) may be configured to exhibit a desired color or graphical pattern, which may be externally perceivable. For example, IMD/IML (in-mold decoration/labeling) procedures may be utilized to arrange embedded graphics in the structure 100.

Further, desired other features potentially including but not limited to optically functional elements such as reliefs may be provided to the structure 100 either as surface or embedded features.

Figure 3:
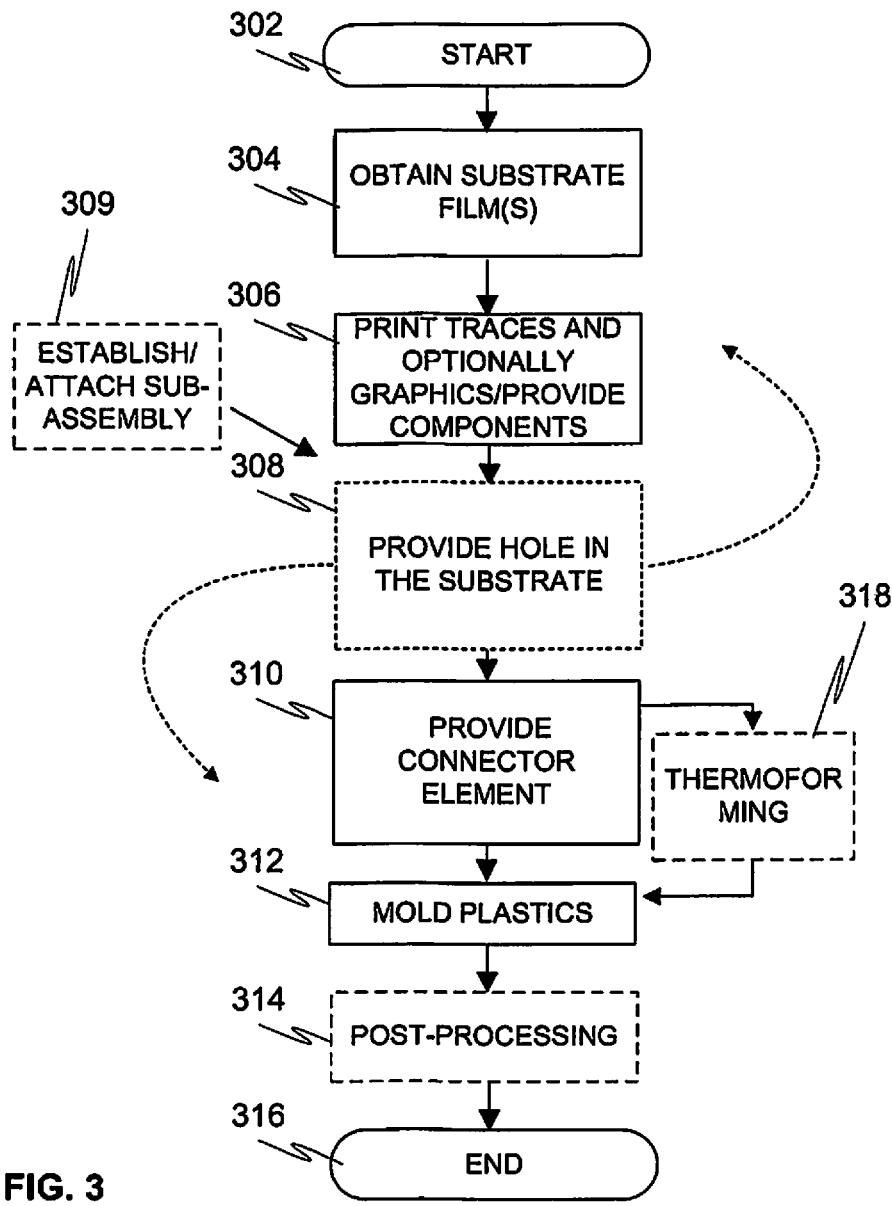
FIG. 3 is a flow diagram disclosing an embodiment of a method in accordance with the present invention.

FIG. 3 depicts a flow diagram 300 disclosing an embodiment of a method in accordance with the present invention.

At the beginning of the method for manufacturing the multilayer structure, a start-up phase 402 may be executed. During start-up 302, the necessary tasks such as material, component and tools selection, acquisition, calibration and other configuration may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, (thermo)forming, electronics assembly, cutting, drilling and/or printing equipment, among others, may be thus ramped up to operational status at this stage.

At 304, at least one, preferably flexible, substrate film of plastics or other preferably planar substrate for accommodating electronics is obtained. A ready-made element, e.g. a roll or sheet of plastic film, may be acquired for use as the substrate material. In some embodiments the substrate film itself may be first produced in-house by molding or other methods from the desired starting material(s). Optionally, the substrate film may be processed further at this stage. It may be, for example, provided with holes, notches, recesses, cuts, etc. as contemplated hereinbefore.

At 306, a number of conductive traces defining e.g. conductor lines, contact pads (or other contact areas), etc. for electrically coupling electronic components, are provided on the film(s), preferably by one or more techniques of printed electronics technology. For example, screen, inkjet, flexographic, gravure or offset lithographic printing may be utilized. Also further actions cultivating the film(s) involving e.g. printing of graphics, visual indicators, etc. on the film(s) may take place here.

Further electronics and/or material non-adherent to molded plastics may be arranged on the substrate, optionally by printing.

Ready-made components such as various SMDs may be attached to the contact areas by solder and/or adhesives. Alternatively or additionally, printed electronics technology may be applied to actually manufacture at least part of the components, such as OLEDs, directly onto the film(s).

At 308, the substrate is preferably provided with a hole, typically but not necessarily a through hole, at a location substantially matching the location of a connector element in the final structure. The hole may be produced by removing material from the substrate using e.g. a drill or by manufacturing the substrate (therefore process-wise combining item 308 with 304) in a manner that it inherently contains the hole (e.g. produced by suitable mold shapes such as a column or pillar) subsequently defined by the surrounding walls of the substrate material. The hole may be further left without or provided/remain with a cover as deliberated hereinbefore.

As indicated in the figure, the hole could be alternatively produced also later, optionally after positioning the connector element on the first side and corresponding surface of the substrate film, for instance.

Preferably the hole is dimensioned and shaped so as to enable external access to the connector element from the second (environment) side of the substrate. Yet, the hole may be configured to accommodate a target portion of the connector element (which will remain at the opening upon and after molding) and/or the cover.

Item 309 refers to possible attachment of one or more sub-systems or 'sub-assemblies' that may incorporate an initially separate, secondary substrate provided with electronics such as IC(s) and/or various components. At least part or all of the electronics of the multilayer structure may be provided to the substrate film(s) via such sub-assembly. Optionally, the sub-assembly may be at least partially overmolded by a protective plastic layer prior to attachment to the main substrate. For example, adhesive, pressure and/or heat may be used for mechanical bonding of the sub-assembly with the primary (host) substrate. Solder, wiring and conductive ink are examples of applicable options for providing the electrical connections between the elements of the sub-assembly and with the remaining electrical elements on the primary substrate. Item 309 could also be executed e.g. upon item 308 or 310. The shown position thereof is primarily exemplary only.

In some embodiments, prior to or upon the molding phase the substrate film(s) optionally already containing electronics may be (thermo)formed 318 or cold formed, for instance, to exhibit a desired three-dimensional (essentially non-planar) shape. The substrate containing thermoformable material may be shaped to better fit the target environment/device or target use. Additionally or alternatively, thermoforming could take place after molding in case the already-established multilayer stack is designed to survive such processing.

At 310, the connector element is provided to the substrate film and preferably attached (secured) thereto using e.g. adhesive, on the first or second side of the substrate and/or inside the hole if it resides therewithin or extends thereto, depending on the embodiment. For example, pick and place equipment may be utilized for the purpose. Yet, it may be electrically connected to the circuit layout on the substrate using e.g. a number of conductive contact elements such as pads, pins, flex cable or wiring, or conductive adhesive, solder or paste. In some embodiments, the connector element may comprise e.g. a substrate or body, a circuit board, a number of electronic components, a sub-assembly, etc. as discussed herein elsewhere. As in various embodiments the connector arrangement may comprise a number of constituent elements or components (e.g. substrate, body, contact members), suitable preparation and/or attachment technique may be selected for each such element/component. E.g. the substrate or body may be bonded to conductors, such as traces or pads, or contact members using conductive ink, epoxy, glue, z-axis glue or ink, optionally together with e.g. thermoplastic bonding.

In some embodiments, specific bonding material for securing physical/mechanical and/or electrical contact with the substrate may be additionally provided e.g. in the form of anisotropic film (containing conductive adhesive/paste) on the substrate for coupling the connector.

Yet, applicable encapsulation such as overmolding or resin dispensing procedure may be applied to secure at least portion of the connector element from the second side of the substrate film.

At 312, at least one, thermoplastic layer is molded upon the first side of the substrate film and electronics thereon, such as traces and a number of electronic components. In practice, the substrate film may be used as an insert in an injection molding process. The first side and associated surface of the substrate film may be, in some embodiments, left with one or more areas free from the molded plastics. The molded layer may, for its part, facilitate securing the connector element.

In case, two films are used, both of them may be inserted in their own mold halves so that the plastic layer is injected between them. Alternatively, the second film could be attached to an aggregate of first film and plastic layer afterwards by suitable lamination technique.

Regarding the resulting overall thickness of the obtained stacked structure, it heavily depends on the used materials and related minimum material thicknesses providing the necessary strength in view of the manufacturing and subsequent use. These aspects have to be considered on case-by-case basis. For example, the overall thickness of the structure could be about 1 mm or a few millimetres, but considerably thicker or thinner embodiments are also feasible.

Item 314 refers to possible post-processing tasks. Further layers may be added into the multilayer structure by lamination or suitable coating (e.g. deposition) procedure. The layers may be of protective, indicative and/or aesthetic value (graphics, colors, figures, text, numeric data, etc.) and contain e.g. textile, leather or rubber materials instead of or in addition to further plastics.

Additional elements such as electronics may be installed at the outer surface(s) of the structure, such as the exterior surface of the substrate. Shaping/cutting may take place. The connector element may be connected to a desired external element such a connector of an external device. For example, these two connectors may together form a plug-and-socket type connection.

Following connecting of the external element to the connector element of the multilayer structure, the established connection and related elements may be further secured and/or protected by additional processing, such as low pressure molding of plastics or resin dispensing (epoxy), whereupon the resulting layer may at least partially encapsulate desired elements (e.g. second side (surface) of film 102, support element 120, cover 121, connector 118, and/or element 119) in the connection region, for example. Low pressure molding or resin dispensing may be exploited to protect and/or secure also other elements, such as electrical elements, of the structure.

At 316, method execution is ended.

Figure 4A:
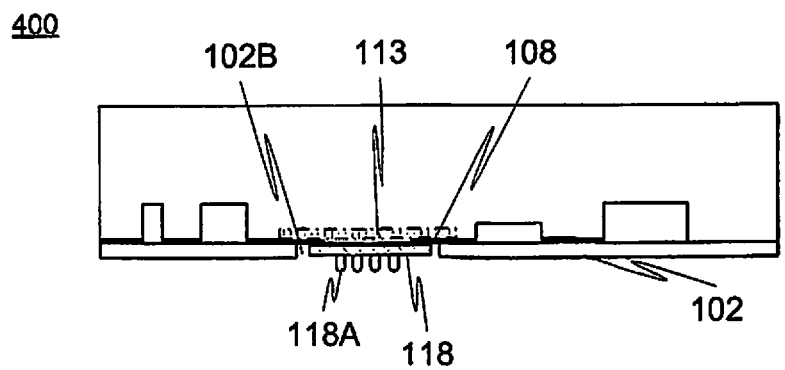
FIG. 4A illustrates a further embodiment of the multilayer structure.

FIG. 4A illustrates, at 400, a further embodiment of the multilayer structure, wherein the connector element 118 is provided with a carrier substrate 113. The substrate 113 may further accommodate at least portion of conductors 108 defining e.g. traces and/or contact pads for electrically connecting the element 118 to the carrier substrate 113 and/or substrate film 102.

Figure 4B:
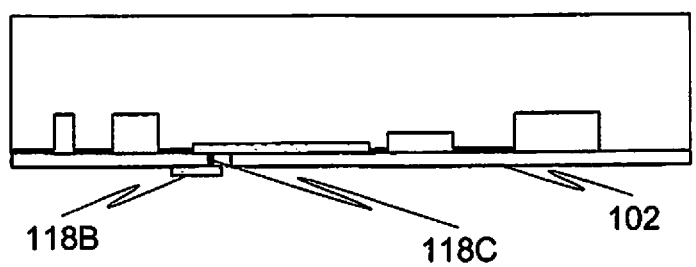
FIG. 4B illustrates still further embodiment of the multilayer structure.

FIG. 4B illustrates, at 410, a further embodiment wherein the connector element 118 is disposed or comprises at least a portion 118B disposed on and preferably extending along the second side and respective surface of the substrate film 102. There may be further elements or layers, e.g. conductors (traces, pads) 108, between the portion 118 and the film 102 (not shown).

There may further be electrical connection 118C established from portion 118B to the first side of the film 102, possibly to the conductors 108 and components 106 arranged thereon, using e.g. conductive material provided in the hole 102B. In some cases, portion of the connector element 118 may be located on the first side of the film 102, with further reference to the next embodiment described below. The contact members 118A may be provided to the portion 118B as well.

Figure 4C:
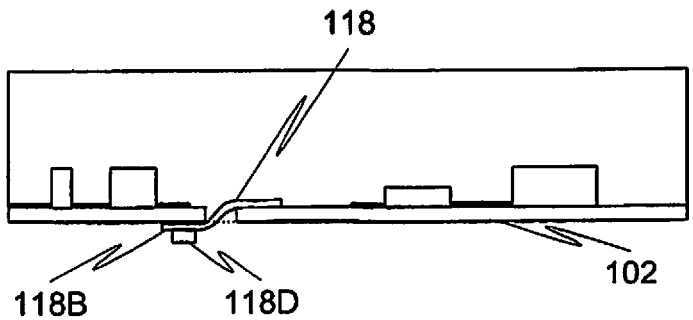
FIG. 4C illustrates yet a further embodiment of the multilayer structure.

Indeed, FIG. 4C illustrates, at 420, a further embodiment wherein at least a portion 118B of the connector element 118, incorporating e.g. a flexible circuit, film or cable, led through 102B the film 102 comprises at least one electronic component 118D, optionally active component, passive component, electromechanical component, optoelectronic component and/or integrated circuit. The portion 118B may be located on the second side of the substrate film 102 as shown, extending from the element 118 towards the environment, for example. The electronic component 118D may be further overmolded or encapsulated using other procedure such as resin dispensing.

Yet, there may be further elements or layers, e.g. conductors (traces, pads) 108, between the portion 118B or generally the connector element 118 and the film 102 (not shown). The contact members 118A may also in this case provided on or in the portion 118B.

A person skilled in the art may easily selectively combine various aforementioned embodiments of the multilayer structure. For example, said at least electronic component 118D of the embodiment of FIG. 4C with optional overmolding or other feasible encapsulation could be introduced into the solution of FIG. 1, 4A, or 4B. Correspondingly, potentially more general or comprehensive encapsulation layer 126 of FIG. 1 could be utilized in connection with the remaining reviewed embodiments.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. For instance, instead of or in addition to molding the plastics directly onto the substrate, the plastic layer could be prepared upfront and then attached to the substrate by suitable lamination technique applying e.g. adhesive, mechanical attachment means (screws, bolts, nails, etc.), pressure and/or heat. Finally, in some scenarios, instead of molding, the plastic or other layer of similar function could be produced on the substrate using a suitable deposition or further alternative method. Yet, instead of printed traces, the traces could be produced/provided otherwise. E.g. a conductor film manufactured utilizing etching, among other options, could be applied.

The invention claimed is:

1. A method for manufacturing a multilayer structure, comprising:
   obtaining a substrate film for accommodating electronics;
   providing conductive traces on a first side of the substrate film to establish a predetermined circuit design;
   providing a connector element having a planar portion that is supported on and by the first side of the substrate film to electrically connect to the predetermined circuit design, wherein the substrate film is arranged with at least one hole aligned with the planar portion of the connector element so that electrically conductive contact members of the connector element are accessible from a second opposite side of the substrate film via the at least one hole, wherein the electrically conductive contact members of the connector element each have opposing ends disposed on the first side of the substrate film; and
   molding thermoplastic material on the first side of the substrate film and the connector element to cover the predetermined circuit design and a first side of the connector element.

2. The method of claim 1, wherein the connector element is a rigid electrical connector.

3. The method of claim 1, further comprising forming the substrate film provided with the conductive traces to exhibit a three-dimensional shape.

4. The method of claim 3, forming the substrate film comprises cold forming the substrate film.

5. The method of claim 3, forming the substrate film comprises thermoforming the substrate film.

6. The method of claim 3, further comprising electrically connecting an electronic component to the circuit before forming the substrate film to exhibit the three-dimensional shape.

7. The method of claim 1, wherein providing the connector element comprises providing at least one of a circuit board or an electronic component.

8. The method of claim 1, further comprising connecting an external element to the connector element followed by at least partially encapsulating a connection region between the external element and the connector element by additional material.

9. The method of claim 8, wherein the encapsulating the connection region by additional material comprises using resin dispensed material.

10. The method of claim 8, wherein the encapsulating the connection region by additional material comprises using low pressure molded material.

11. The method of claim 8, wherein connecting the external element to the connector element includes connecting an external connector to the connector element.

12. The method of claim 1, wherein arranging the substrate film with at least one hole further comprises arranging the substrate film with at least one through hole.

13. The method of claim 1, wherein the providing the electronic traces further comprises providing electronic components.

14. The method of claim 1, wherein the providing the electronic traces is accomplished at least in part by printed electronics technology.

15. The method of claim 1, wherein the planar portion of the connector element is a plate.

16. The method of claim 1, wherein obtaining the substrate film includes the substrate film being a thermoplastic substrate film.

17. A method for manufacturing a multilayer structure, comprising:
   creating conductive traces on a first side of a substrate film to establish a circuit;
   arranging a planar connector element on the first side of the substrate film over a hole defined through the substrate film, wherein the connector element has opposing lateral ends that overlap and are supported on respective edges of the substrate film, the edges of the substrate film defining the hole therebetween;
   molding thermoplastic material on the first side of the substrate film and a first side of the connector element to cover the circuit and the first side of the connector element; and
   accessing a second side of the connector element opposite the first side of the connector element to connect an electrical component to the circuit via an electrically conductive contact member of the connector element, wherein the electrically conductive contact member of the connector element has opposing ends disposed on the first side of the substrate film.

18. The method of claim 17, wherein accessing the second side of the connector element includes accessing a rigid electrical connector of the connector element.

19. The method of claim 17, wherein arranging the planar connector element on the first side of the substrate film includes the planar connector element being a plate.

20. The method of claim 17, wherein arranging the planar connector element on the first side of the substrate film includes the planar connector element being a metal plate.

* * * * *